(12) United States Patent
Chu

(10) Patent No.: US 7,068,096 B2
(45) Date of Patent: Jun. 27, 2006

(54) EER MODULATOR WITH POWER AMPLIFIER HAVING FEEDBACK LOOP PROVIDING SOFT OUTPUT IMPEDANCE

(75) Inventor: Peter F. Chu, Poway, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 62 days.

(21) Appl. No.: 10/731,615

(22) Filed: Dec. 8, 2003

(65) Prior Publication Data
US 2005/0122163 A1 Jun. 9, 2005

(51) Int. Cl.
*H03F 3/38* (2006.01)
(52) U.S. Cl. .......................... 330/10; 330/136
(58) Field of Classification Search .......... None
See application file for complete search history.

(56) References Cited

U.S. PATENT DOCUMENTS

| | | | |
|---|---|---|---|
| 5,905,407 A | 5/1999 | Midya | 330/10 |
| 6,084,468 A * | 7/2000 | Sigmon et al. | 330/10 |
| 6,130,910 A | 10/2000 | Anderson et al. | 375/238 |
| 6,300,826 B1 | 10/2001 | Mathe et al. | 330/10 |
| 6,486,733 B1 * | 11/2002 | Myers et al. | 330/10 |
| 6,590,940 B1 | 7/2003 | Camp, Jr. et al. | 375/297 |
| 6,801,082 B1 * | 10/2004 | Midya et al. | 330/10 |
| 2002/0079960 A1 | 6/2002 | Myers et al. | 330/10 |

OTHER PUBLICATIONS

Cocconi, A., Slobodan, C., and Middlebrook, R.D., "High-Frequency Isolated 4kW Photovoltaic Inverter for Utility Interface", *Proceedings of the S venth International PCI '83 Conference*, 1983, pp. 325-342, Interec Communications, Switzerland.
Cripps, S., "RF Power Amplifiers for Wireless Communications", 1999, pp. 246-247, Artech House, USA.

* cited by examiner

*Primary Examiner*—Khanh V. Nguyen
(74) *Attorney, Agent, or Firm*—Law Office of Robert M. Wallace

(57) ABSTRACT

An EER amplifier for amplifying an RF signal includes:
(II) a first RF amplifier for amplifying the phase portion of the signal;
(III) an EER modulator for amplifying the envelope or baseband portion of the signal, including:
  A) a high frequency operational amplifier;
  B) a power amplifier;
  C) a feedback control loop including:
  (1) a current-to-voltage conversion amplifier having an input coupled to a current monitoring output of the power amplifier and an output,
  (2) an input buffer amplifier having an input coupled to receive the envelope signal and an output;
  (3) a summing amplifier having:
    (a) an input coupled to the outputs of: (a) the current-to-voltage conversion amplifier and (b) the input buffer amplifier, and
    (b) an output coupled to the current control input of the power amplifier.

18 Claims, 4 Drawing Sheets

US 7,068,096 B2

EER MODULATOR WITH POWER AMPLIFIER HAVING FEEDBACK LOOP PROVIDING SOFT OUTPUT IMPEDANCE

BACKGROUND OF THE INVENTION

The invention concerns improvements in wideband power amplifiers for communication of RF signals and in particular to power amplifiers employing envelope elimination and restoration (EER) of the type disclosed in U.S. Pat. No. 6,300,826 to Mathe et al.

An EER amplifier separates an incoming complex signal, $A(t)e^{j(\omega t+\phi(t))}$, into two channels, the amplitude channel carrying $A(t)$ and phase channel carrying $e^{j(\omega t+\phi(t))}$; where $\phi(t)$ is the time-dependent phase of the incoming signal, $\omega$ is the carrier frequency and $A(t)$ is the amplitude or envelope. The envelope $A(t)$ has frequency bandwidth from DC to the maximum base band frequency, while the phase channel retains the original carrier frequency and contains only the phase information after the amplitude or envelope $A(t)$ is eliminated. A highly linear power amplifier, such as a class AB amplifier, amplifies the signal in the phase channel. The envelope is restored in the amplified signal by an EER modulator that modulates the bias power of the linear power amplifier in accordance with the envelope $A(t)$. The envelope $A(t)$ is a very wideband signal, containing frequency components ranging from the maximum base band frequency down to D.C. The EER modulator must have the capability of faithfully reproducing and amplifying all components in this wideband signal.

This extremely wideband modulator, working as a power supply for the power amplifier, must have high power gain, high efficiency and broad frequency response, because it directly affects the overall system power efficiency. To achieve these goals, two amplifiers are employed: one amplifier has a low to high frequency response, but low efficiency and low power; the other covers from D.C. to about 50% bandwidth, and delivers high current with high efficiency. The high frequency amplifier amplifies the highest frequency components of the envelope signal while the power amplifier amplifies the remaining (medium frequency, low frequency, and D.C.) components. The power amplifier must be capable of generating high current at low frequencies, while the high frequency amplifier must be capable of replicating high frequency components in the incoming signal (leading and trailing edges, spikes, and the like). The two amplifiers are therefore very different in their output characteristics. The difficulty arises in combining the outputs of the two amplifiers so as to obtain a faithful amplified reproduction of the envelope signal $A(t)$. The above-referenced patent to Mathe et al. discloses one technique in which a feedback loop governs the output of the power amplifier based upon the output of the high frequency amplifier.

The technique for combining the outputs of the two different amplifiers disclosed in the above-referenced patent to Mathe et al. has been found to be inadequate. Therefore, there is still a need for a way of combining the outputs of the high frequency amplifier and the power amplifier to attain a faithful amplified reproduction of the input signal.

In considering this problem, I recognized that the disparity between the output impedances of the high frequency and power amplifiers was a source of difficulty. Specifically, the high frequency amplifier is typically a low output impedance voltage source, while the power amplifier is typically a PWM (pulse-width modulated) switching mode, high efficiency with a relatively high output impedance source. I also recognized another difficulty with the Mathe et al. technique is the use of the high frequency amplifier output current to govern the output of the power amplifier. The real need was to govern the output of the power amplifier in such a way as to minimize differences between the power amplifier's output and the actual envelope signal $A(t)$, while at the same time solving the problem of the disparity between the output impedances of the two amplifiers.

SUMMARY OF THE INVENTION

An EER amplifier for amplifying AM signal includes:
(I) a divider for dividing the signal into two paths: a phase signal and an envelope signal;
(II) a first RF amplifier for amplifying the signal, the first amplifier having a bias supply input;
(III) an EER modulator having input receiving the envelope signal and an output coupled to the bias supply input of the first RF amplifier, the EER modulator comprising:
  (A) a power operational amplifier for amplifying a high frequency portion of the envelope signal, and having an output coupled to the output of the EER modulator;
  (B) a high efficiency power amplifier for amplifying a remaining portion of the envelope signal, the power amplifier having:
    (1) a PWM (Pulse-Width-modulator) waveform generator input,
    (2) a current monitoring output,
    (3) a power output coupled to the output of the EER modulator;
  (C) a feedback control loop comprising:
    (1) a current-to-voltage conversion amplifier having an input coupled to the current monitoring output of the high efficiency power amplifier and an output,
    (2) an inverted input buffer amplifier having an input coupled to receive the envelope signal and an output;
    (3) a summing amplifier having:
      (a) an input coupled to the outputs of: (a) the current-to-voltage conversion amplifier and (b) the inverted buffer amplifier, and
      (b) an output coupled to the current control input of the high efficiency power amplifier.

The high efficiency power amplifier has a first gain and the feedback control loop has a second gain, and the product of the first and second gains provides an active resistance at the power output of the power amplifier, exceeding an output impedance of the power operational amplifier. The power operational amplifier has output impedance less than 1 Ohm, and the active resistance of the power amplifier is typically between about 5 and 10 Ohms.

DETAILED DESCRIPTION OF THE INVENTION

The problems referred to above in the background discussion are solved in the present invention by a novel feedback loop in the EER modulator that minimizes differences between the output impedances of the high efficiency power amplifier and high frequency voltage operational amplifier. In this feedback loop, the power amplifier is servoed so as to minimize differences between its output current and the actual envelope signal. Furthermore, the gain of the feedback loop and the gain of the power amplifier are selected to fix the active output resistance of the power amplifier at a level that is compatible with the output resistance of the high frequency operational amplifier. Preferably, this level corresponds to a "soft" output impedance on the order of about 5–10 Ohms and more preferably about 6 Ohms, depending upon the output impedance of the high frequency amplifier. In this way the power amplifier combines the advantages of both a low impedance voltage source and a high power current source.

The feedback loop essentially subtracts a signal representing the EER modulator power amplifier output current from the actual envelope signal, and employs the resulting difference as a corrective signal governing the EER modulator power amplifier output current. The feedback loop employs amplifiers whose gains determine the gain of the feedback loop. The feedback loop gain is selected so that the product of the feedback loop gain and the power amplifier gain yields the desired power amplifier active output resistance, corresponding to the "soft" impedance discussed above.

Figure 1:
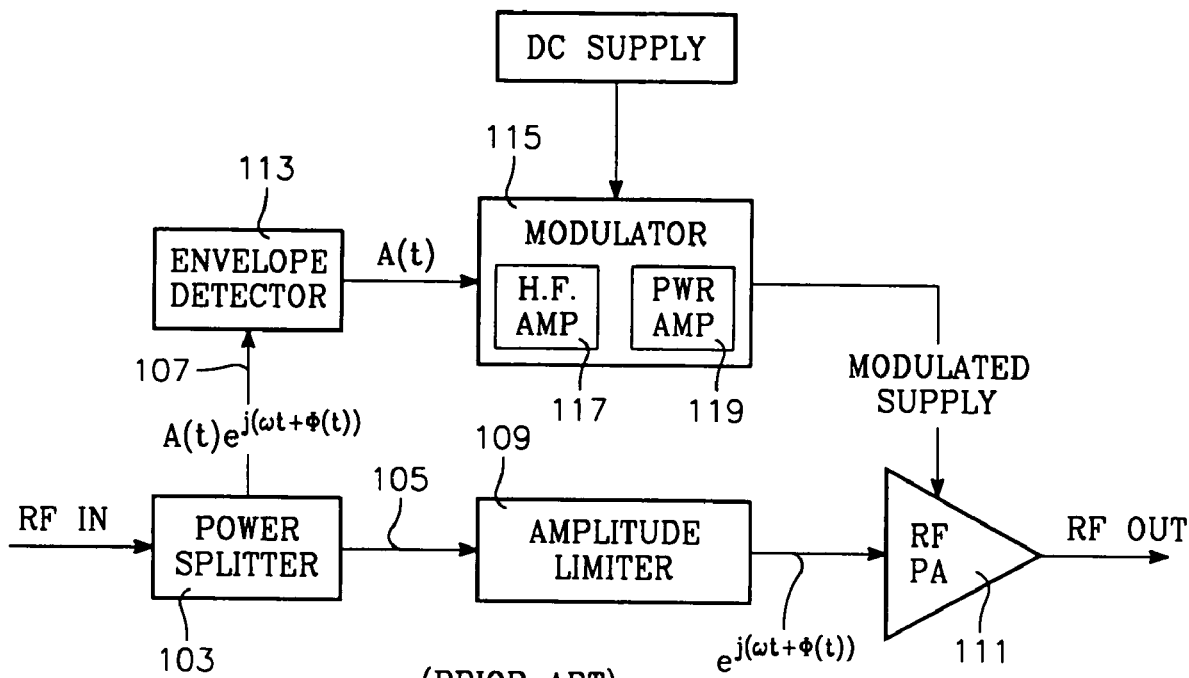
FIG. 1 is a block diagram of an EER communication amplifier of the type disclosed in the prior art, including an EER modulator.
Figure 2:
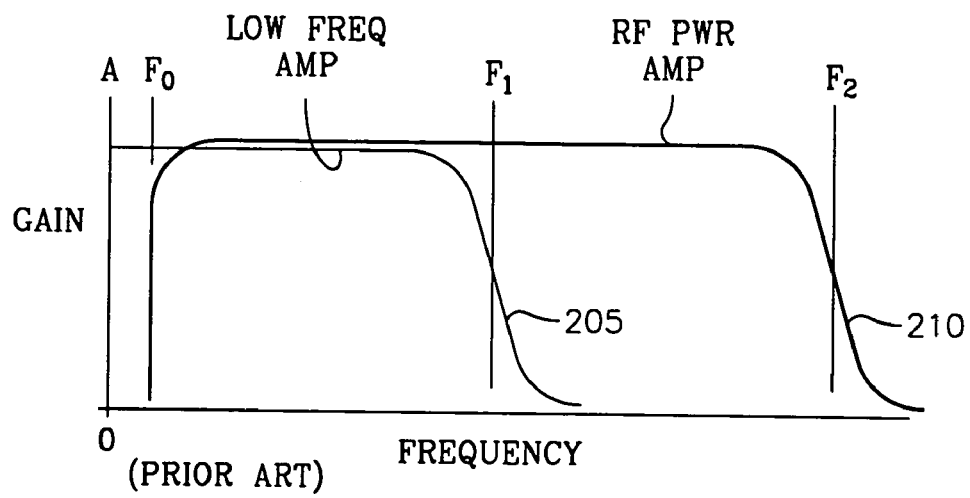
FIG. 2 is a graph illustrating the frequency responses of a pair of amplifiers in the EER modulator of FIG. 1, including a high efficiency power amplifier and a wideband power operational amplifier.

Referring to FIG. 1, an EER communication amplifier accepts an input signal, which is split by a power splitter 103 into a phase channel 105 and an amplitude channel 107. The input signal is treated as a signal of the form $A(t)e^{j(\omega t + \phi(t))}$. In the phase channel 105, a hard limiter 109 eliminates the base band envelope from the signal, leaving only the carrier frequency and its phase portion of the signal, namely $e^{j(\omega t + \phi(t))}$, which is amplified in a power amplifier 111. The lower frequency envelope signal A(t) is obtained by an envelope detector 113 with a low-pass-filter (to the exclusion of the phase portion), and this envelope signal is amplified in an EER modulator 115, whose output supplies high current voltage for the power amplifier 111. In this way, the output of the power amplifier is modulated in accordance with the envelope signal A(t). Thus, the high efficiency of the power amplifier is achieved because of the high efficiency of the base band EER Modulator. The envelope signal A(t) could have a very wide frequency spectrum, and it is difficult to provide an EER modulator capable of faithfully amplifying across such a wide frequency band at the required output power and current. Typically, this difficulty is addressed by including in the EER modulator 115 both a high frequency operational amplifier 117 and a high efficient low frequency power amplifier 119 to handle different portions of the spectrum of the wideband envelope signal A(t). FIG. 2 illustrates the apportionment of the wideband spectrum of the envelope signal A(t) among the two amplifiers of the EER modulator 115, namely a low frequency spectrum 205 (from DC up to a frequency F1) which is amplified by the power amplifier 119, and a high frequency spectrum 210 (up to a frequency F2) which is amplified by the high frequency amplifier 117.

Figure 3:
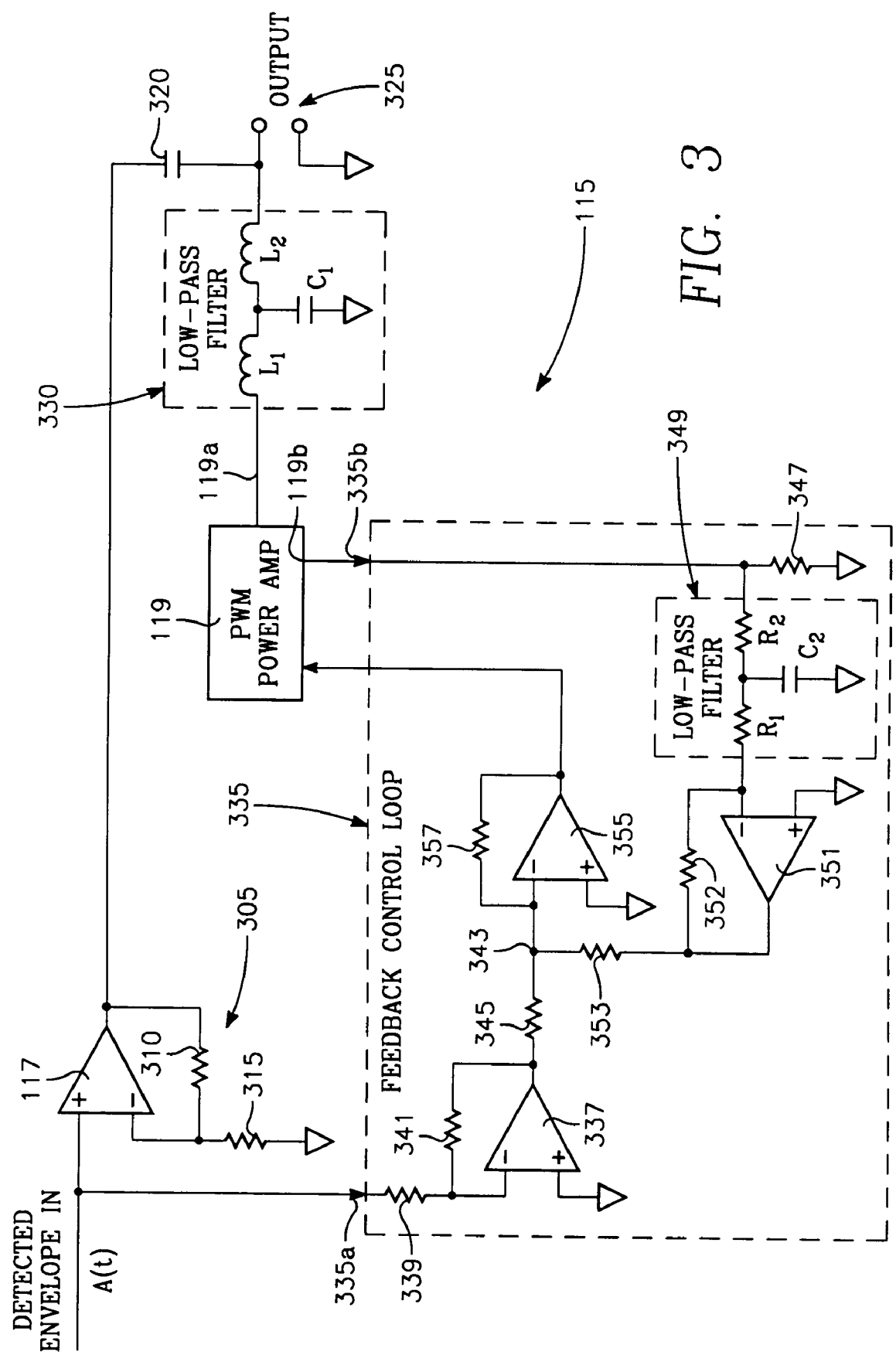
FIG. 3 is a schematic block diagram illustrating an embodiment of the EER modulator in accordance with present invention, including a power operational amplifier and a pulse-width modulated (PWM) power amplifier with a feedback control loop.

FIG. 3 illustrates the EER modulator 115 in accordance with the present invention, including the high frequency operational amplifier 117 and the switching power amplifier 119. The high frequency amplifier 117 is an operational power amplifier preferably with a push-pull power output stage. Such amplifiers amplify high frequencies faithfully, but are very inefficient at high power. Therefore it is DC blocked with capacitor 320, and used to cover only an upper portion of a wide frequency band. The high frequency operational amplifier 117 has a negative feedback loop 305 between its output and its negative input through a voltage divider consisting of resistors 310, 315. The negative feedback loop 305 reduces distortion and output impedance. The output of the high frequency operational amplifier 117 is coupled through a high pass filter capacitor 320 to the output 325 of the EER modulator. The output 325 of the EER modulator is the power supply of the amplifier ill in the phase channel 105 of FIG. 1.

The main output 119a of the PWM power amplifier 119 is coupled through a low-pass filter 330 to the output node 325 and is governed by a feedback control loop 335. The low-pass filter 330 may be a T-network, as shown, consisting of series inductors L1 and L2 and shunt capacitor C1. The feedback control loop 335 has a first input 335a connected to the input of the EER modulator 115 of FIG. 1 so that it receives the envelope signal A(t). The feedback control loop 335 has a second input 335b connected to a secondary output 119b of the power amplifier 119. This secondary output 119b is relatively isolated from the main output 119a and output filter 330, but has an output current approximating that of the main output 119a, as will be described later in this specification. As will be apparent from the following description, the feedback control loop 335 essentially compares the output of the power amplifier 119 (input 335b) with the envelope signal (input 335a) and controls the output current of the power amplifier 119 so as to minimize this difference.

An input buffer amplifier 337 has its negative input connected to the feedback loop input 335a through a series resistor 339. A feedback resistor 341 is connected across the output and negative input of the input buffer amplifier 337 forming an inverted amplifier. The output of the buffer amplifier 337 is connected to a summing node 343 through a series resistor 345.

A current sensor resistor 347 has a voltage across it that is related to the output current of the power amplifier 119 through the feedback loop input 335b. This voltage is applied through a low pass filter 349 to the negative input of an operational amplifier 351, also forming an inverted amplifier. The low-pass filter 349 may be a T-network as shown with shunt capacitor C2 and series resistors R1 and R2. The inverted operational amplifier 351 has a feedback resistor 352 connected across its output and negative input. The output of the current-to-voltage converter amplifier 351 is connected through a series resistor 353 to the summing node 343. The summing node 343 is connected to the negative input of a summing amplifier 355 having a feedback resistor 357 connected across its output and negative input. Because of the relationship between the current drop across the sensor resistor 347 and the voltage at the output of the current-to-voltage converter amplifier 351, the summing node has a voltage related to the difference between the envelope signal A(t) and output current of the power amplifier 119. The feedback control loop 335 responds to this difference by controlling the output current of the power amplifier 119 in such a manner as to minimize the voltage error. The result is that the integration of the amplifiers 117 and 119 at the output node 325 is more faithful to the detected envelope signal A(t) received at the EER modulator input and achieves a high power gain and high power efficiency.

The feedback loop 335, in addition improving the quality of the EER modulator output signal, sets the active output resistance of the power amplifier 119 to a desirable level, preferably a "soft" impedance greater than 5 Ohm and less than 10 Ohms. The output resistance of the power amplifier 119 with the feedback loop 335 is the product of the gains of the power amplifier 119 and the feedback loop 335. The gains of the amplifiers 337, 351, and 355 are selected to set the feedback loop gain accordingly. These gains are set by appropriately selecting the resistances of the resistors 339, 341, 345, 352, 353, 357 of the feedback control loop 335, in accordance with pre-determined calculation. Such a calculation may be carried out in accordance with standard practice and therefore need not be disclosed here. The output impedance of the high frequency amplifier 117 is very low across the entire pass band, and gradually increases at high end. If the switching power amplifier output resistance is too high, the efficiency will be low. The "soft" output impedance value (in the range of 1 to 10 Ohms) enables the power amplifier 119 to combine the characteristics of both a low impedance voltage source and a high current source. As a current source, the power amplifier 119 is able to sustain high current levels for long periods characteristic of low frequency or D.C. waveforms, which the high frequency amplifier 117 cannot do.

Figure 4:
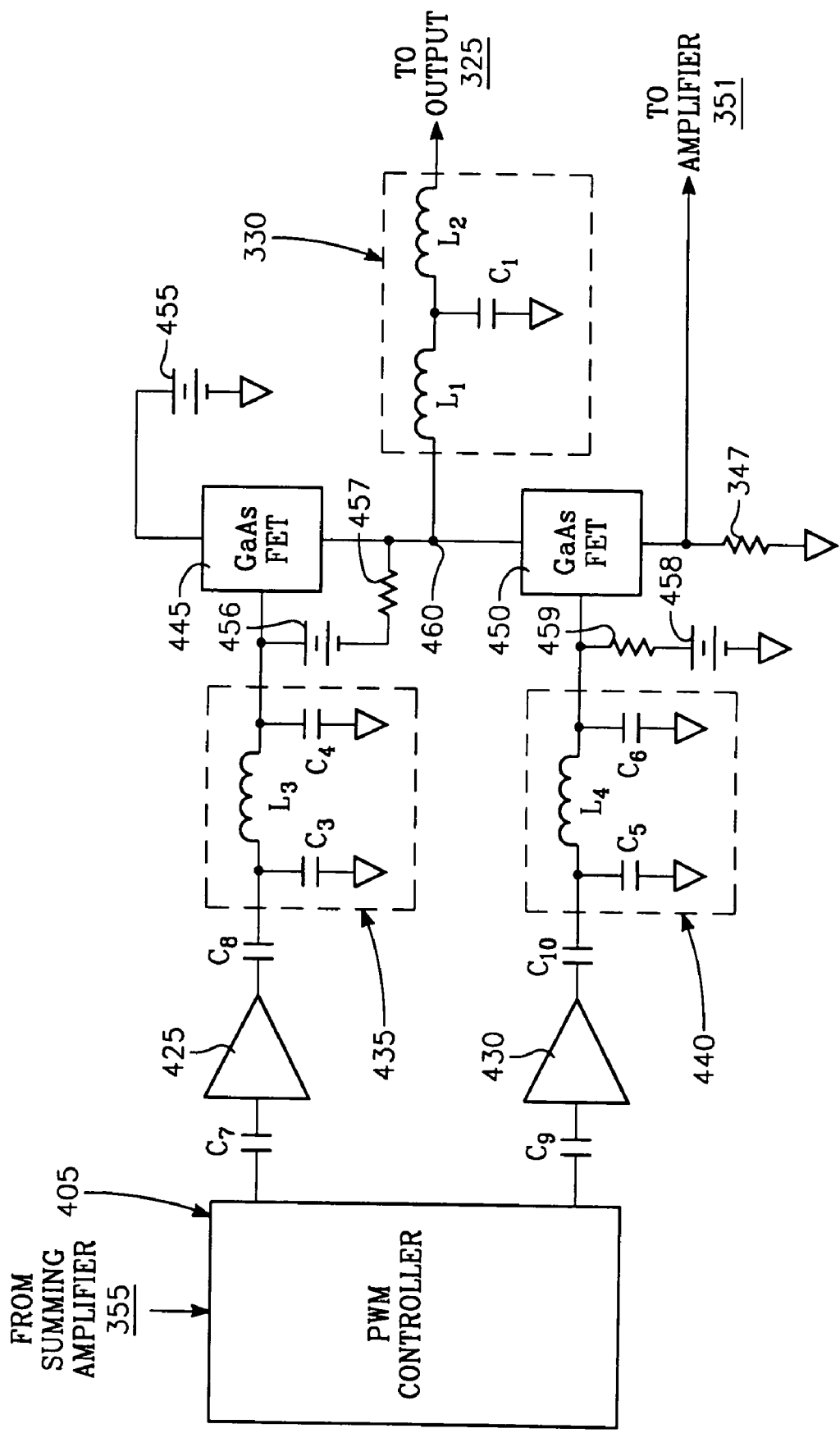
FIG. 4 is a block diagram of the PWM power amplifier of the EER modulator of FIG. 3.
Figure 5A:
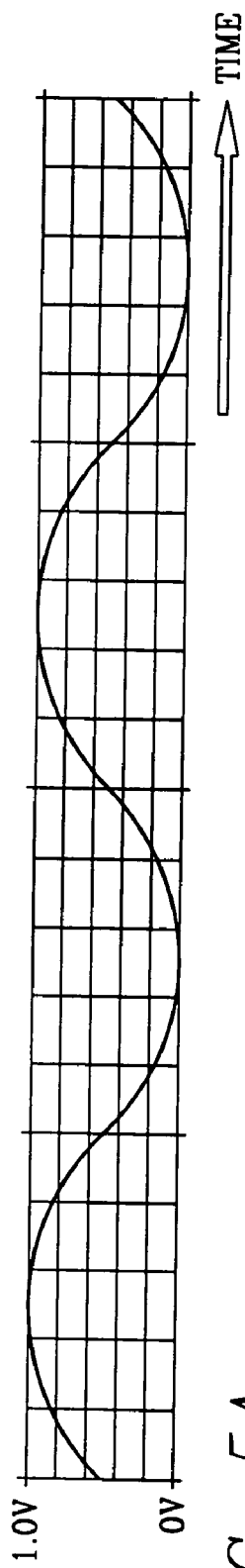
FIGS. 5A, 5B and 5C are contemporaneous timing diagram of waveforms illustrating the pulse-width modulation control of the PWM power amplifier.
Figure 5B:
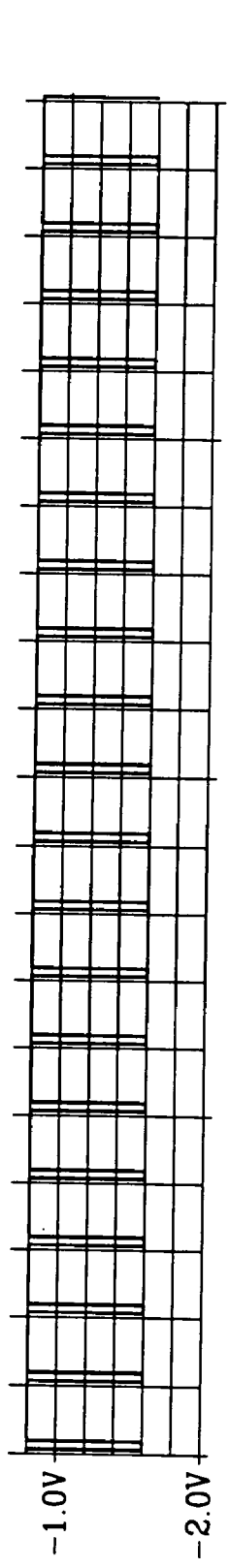
Figure 5C:
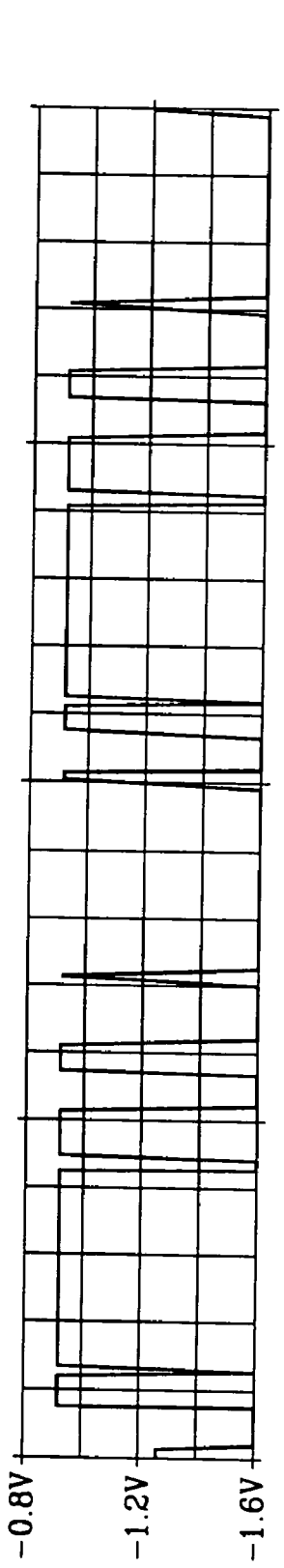

FIG. 4 illustrates a possible implementation of the PWM power amplifier 119, and its connection to the summing amplifier 355 of FIG. 3. A PWM controller 405 takes the error signal generated from the feedback control loop 335, and produces a stream of pulses. The pulse width of these pulses varies according to the input voltage. Their waveform is illustrated in FIG. 5. The PWM controller 405 generates two digital pulse trains, which are complementary, i.e., they are identical but 180 degrees out of phase. The generation of one of the complementary pulse trains is illustrated in the contemporaneous timing diagrams FIGS. 5A through 5C. FIG. 5A depicts the time domain waveform of a typical input signal to the controller 405 from the summing amplifier 355. FIG. 5B depicts a sampling signal used in the controller 405 to sample the input signal of FIG. 5A. FIG. 5C illustrates the pulse-width modulated output signal generated by the controller 405 from a comparison of the waveforms of FIGS. 5A and 5B. Typically, the input signal or voltage (of FIG. 5A) is sampled (by the signal of FIG. 5B) at a rate of at least 10 times its maximum frequency.

The pulses are amplified in respective preamplifiers 425, 430, and are then applied through respective low-pass impedance matched networks 435, 440 to the gates of respective high power field effect transistors (FETs) 445, 450. Each matching network may be a pi-network, as illustrated, the network 435 consisting of a series inductor L3 and shunt capacitors C3 and C4 and the network 440 consisting of a series inductor L4 and shunt capacitors C5 and C6. The FETs have their source-to-drain channels connected in series between a high voltage supply 455 and the current sensing resistor 347 of FIG. 3, and the common node between them 460 is connected through a low-pass filter 330 to the output node 325 of FIG. 3. This configuration is very similar to a Buck Switching circuit, but works at much higher frequency. The FET 445 has a gate bias voltage source 456 and resistor 457. The FET 450 has a gate bias source 458 and resistor 459. The purpose of the bias network is to keep the FET in the off mode when no input is present. The preamplifier 425 may be AC coupled through an input capacitor C7 and output capacitor C8. The preamplifier 430 may be AC coupled through input capacitor C9 and output capacitor C10.

A conventional PWM controller may be employed to carry out the invention at least for some frequency ranges, so no detailed description of the PWM controller is necessary here for the skilled worker to make the invention.

While the invention has been described by specific reference to preferred embodiments, it is understood that variations and modifications thereof may be made without departing from the true spirit and scope of the invention.

What is claimed is:

1. An EER amplifier for amplifying a signal, comprising:
   (I) a divider for dividing said signal into a phase signal and an envelope signal;
   (II) a first RF amplifier for amplifying said signal, said first amplifier having a bias supply input;
   (III) an EER modulator having input receiving said envelope signal and an output coupled to said bias supply input of said first RE amplifier, said EER modulator comprising:
   (A) a high frequency power operational amplifier for amplifying a high frequency portion of said envelope signal, and having an output coupled to said output of said EER modulator;
   (B) a high efficiency power amplifier for amplifying a remaining portion of said envelope signal, said power amplifier having:
      (1) a current control input,
      (2) a current monitoring output,
      (3) a power output coupled to said output of said EER modulator;
   (C) a feedback control loop comprising:
      (1) a current-to-voltage conversion amplifier having:
         (a) an input coupled to said current monitoring output of said high efficiency power amplifier and
         (b) an output,
      (2) an input buffer amplifier having: (a) an input coupled to receive said envelope signal and (b) an output;
      (3) a summing amplifier having:
         (a) an input coupled to the outputs of: (a) said current-to-voltage conversion amplifier and (b) said input buffer amplifier, and
         (b) an output coupled to said current control input of said high efficiency power amplifier.

2. The apparatus of claim 1 wherein said power amplifier has a first gain and said feedback control loop has a second gain, and wherein the product of said first and second gains provides an active resistance at the power output of said high efficiency power amplifier exceeding an output impedance of said high frequency operational power amplifier.

3. The apparatus of claim 2 wherein said high frequency operational power amplifier has an output impedance less than 1 Ohm, and wherein said active resistance of said power amplifier is between about 5 and 10 Ohms.

4. The apparatus of claim 3 wherein said active resistance is between about 1 and 10 Ohms.

5. The apparatus of claim 1 wherein high efficiency power amplifier comprises a pair of power output transistors having source-to-drain channels connected in series, said power output being the connection between said pair of output transistors, said current monitoring output comprising a drain of one of said pair of transistors, said apparatus further comprising a voltage drop resistor connected to said drain, said input of said current-to-voltage converter amplifier being connected across said voltage drop resistor.

6. The apparatus of claim 1 wherein said high efficiency power amplifier is a switching pulse-width modulation amplifier comprising:
  a pulse-width modulation controller for generating a complementary pair of pulse signals whose pulse widths are functions of said current control input;
  a pair of power FETs having source-to-drain channels connected in series across a bias power source and respective gates controlled by respective ones of said complementary pair of pulse signals, said source-to-drain channels being connected together at a node constituting said power output of said power amplifier.

7. The apparatus of claim 6 further comprising respective preamplifier stages for amplifying respective ones of said complementary pair of pulse signals.

8. The apparatus of claim 6 wherein said pulse-width modulation controller comprises a voltage to pulse width generator and a complementary pair of outputs transitioning between opposite binary states upon a change in amplitude comparison between the output of said summing amplifier and the pulse width generator.

9. An amplifier comprising:
  a divider circuit for dividing an incoming signal into a low frequency amplitude modulation envelope signal and a phase portion;
  a first RF amplifier for amplifying said phase portion, said first RF amplifier having a bias supply input;
  a modulator connected to receive said envelope signal for furnishing a modulated bias supply to said bias supply input of said first RF amplifier, said modulator comprising:
    a high frequency operational amplifier for amplifying a higher frequency portion of said envelope signal and a power amplifier for amplifying a lower frequency portion of said envelope signal, said power amplifier having an output current control input and an output current monitoring port;
    a feedback control loop having first and second inputs and a control output connected to said output current control input of said power amplifier, said first and second inputs connected respectively to said envelope signal and said output current monitoring port of said power amplifier, said feedback control loop comprising means for producing at said control output a signal which is a function of a difference between said envelope signal and the output current at said monitoring port of said power amplifier, whereby said feedback control loop controls the output current of said power amplifier so as to minimize said difference.

10. The amplifier of claim 9 wherein said power amplifier has a first gain and said feedback control loop has a second gain, the combination of said power amplifier and said feedback control loop having an active output resistance which is a function of the product of said first and second gains.

11. The amplifier of claim 10 wherein said high frequency operational amplifier has a low output impedance and said active output resistance of said power amplifier is greater than said low output impedance of said high frequency operational amplifier by less than a factor of 100.

12. The amplifier of claim 11 wherein said active output resistance is greater than said low output impedance by less than a factor of ten.

13. The amplifier of claim 12 wherein said active output resistance is between about 1 and 10 Ohms.

14. The amplifier of claim 9 wherein said power amplifier is a pulse-width modulated amplifier having a large output current capability at low frequencies.

15. The amplifier of claim 14 wherein said power amplifier comprises an output node connected by a pair of transistors to respective opposing voltage sources and a pulse-width modulation controller responsive to said output current control input, for applying complementary pulse-width modulated signals to gates of respective ones of said pair of transistors.

16. In an envelope elimination and restoration (EER) amplifier, an EER modulator comprising:
  a high frequency amplifier having an input coupled to receive an envelope signal and an output having an output impedance;
  a power amplifier having a first gain, outputs of said high frequency amplifier and said power amplifier being coupled to an EER modulator output node;
  a feedback control loop having a first input coupled to receive said envelope signal and a second input coupled to receive an output signal of said power amplifier, said feedback control loop providing an input to said power amplifier to minimize a difference between the output of said power amplifier and said envelope signal;
  said feedback control loop having a first gain and said power amplifier having a second gain, said first and second gains being such that the output impedance of the combination of said power amplifier and feedback control loop does not exceed said output impedance of said high frequency amplifier by more than a factor of ten.

17. The apparatus of claim 16 wherein said high frequency amplifier has an output impedance less than 1 Ohm, and the combination of said power amplifier with said feedback loop has an output impedance between about 5 and 10 Ohms.

18. The apparatus of claim 16 wherein said high frequency amplifier amplifies signals over a relatively narrow high frequency band and said power amplifier amplifies signals over a wide frequency band below said narrow high frequency band.

* * * * *